United States Patent
Cok et al.

(10) Patent No.: US 6,717,560 B2
(45) Date of Patent: Apr. 6, 2004

(54) SELF-ILLUMINATING IMAGING DEVICE

(75) Inventors: Ronald S. Cok, Rochester, NY (US); David J. Williams, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/264,050

(22) Filed: Oct. 3, 2002

(65) Prior Publication Data

US 2003/0048239 A1 Mar. 13, 2003

Related U.S. Application Data

(63) Continuation of application No. 09/571,614, filed on May 15, 2000.

(51) Int. Cl.[7] .................................................. G09G 3/32
(52) U.S. Cl. .............................. 345/82; 345/81; 345/83; 345/84; 345/85
(58) Field of Search ............................... 345/81–85, 156; 356/71, 343; 359/295; 385/31; 392/45; 600/322; 365/106

(56) References Cited

U.S. PATENT DOCUMENTS

| 4,769,292 A |   | 9/1988  | Tang et al. |
|---|---|---|---|
| 5,025,321 A |   | 6/1991  | Leksell et al. |
| 5,061,569 A | * | 10/1991 | VanSlyke et al. ............ 428/457 |
| 5,313,055 A |   | 5/1994  | Shiratsuki et al. |
| 5,371,384 A |   | 12/1994 | Wada |
| 5,625,635 A | * | 4/1997  | Kurtz et al. ................... 372/45 |
| 5,696,714 A | * | 12/1997 | Russell ....................... 365/106 |
| 5,929,845 A | * | 7/1999  | Wei et al. .................... 345/156 |
| 6,122,042 A |   | 9/2000  | Wunderman et al. |
| 6,195,196 B1 | * | 2/2001  | Kimura et al. ............... 359/295 |
| 6,259,838 B1 | * | 7/2001  | Singh et al. ................... 385/31 |
| 6,327,376 B1 |   | 12/2001 | Harkin |
| 6,351,078 B1 | * | 2/2002  | Wang et al. .............. 315/169.3 |
| 6,397,091 B2 |   | 5/2002  | Diab et al. |

FOREIGN PATENT DOCUMENTS

| EP | 0 554 825 A1 | 2/1993 |
|---|---|---|
| EP | 0 573 984 A1 | 6/1993 |
| EP | 0 606 736 A2 | 12/1993 |
| EP | 0 774 787 A2 | 5/1997 |
| EP | 0 827 323 A1 | 3/1998 |
| JP | 62-151068 | 7/1987 |
| JP | 10-93785 | 4/1998 |
| JP | 11-177785 | 7/1999 |
| JP | 2000-106617 | 4/2000 |
| WO | WO 99/09603 | 2/1999 |

* cited by examiner

Primary Examiner—Amare Mengistu
Assistant Examiner—Prabodh M. Dharia
(74) Attorney, Agent, or Firm—Andrew J. Anderson; Thomas H. Close

(57) ABSTRACT

A self-illuminating solid-state color image capture device, includes: an array of light emitting elements and light sensing elements formed on a common substrate; the light emitting elements including first color elements adapted to emit light of a first color and second color elements adapted to emit light of a second color, and the light sensing elements being responsive to all emitted colors; and electronics coupled to the light emitting and light sensing elements for sequentially causing the first and second color elements to emit light and sensing the light reflected from a scene being captured with the light sensing elements.

27 Claims, 4 Drawing Sheets

SELF-ILLUMINATING IMAGING DEVICE

CROSS REFERENCE TO RELATED APPLICATIONS

Continuation of prior application Ser. No. 09/571,614, filed on May 15, 2000.

This is a Continuation of application Ser. No. 09/571,614 filed May 15, 2000 by Ronald S. Cok et al., entitled Self-Illuminating Imaging Device.

FIELD OF THE INVENTION

The present invention relates to solid-state capture and display devices, in particular, the integration of both light-emitting and light-capturing means in a common solid-state device.

BACKGROUND OF THE INVENTION

Image display devices are well known and are based upon a variety of mechanisms such as electron-beam stimulated phosphors, liquid crystal displays, light-emitting diodes, vacuum fluorescence, and even arrays of light bulbs. Likewise, image capture devices are commonly used with a variety of technologies such as film or the solid state capture of photons using charge coupled devices (CCDs). These image capture devices all require an external source of scene illumination to create the photons they detect.

Typically, a system will rely on an illuminator (such as sunshine, camera flashes, or incandescent and fluorescent lights) to light a scene. The light from the scene is then focused through suitable optics onto an imaging device. The imaging device captures the photons and enables either a re-creation of the scene at a later time (as conventional film does) or immediate analysis or playback (as with television and most solid-state devices such as CCDs). In every case, separate mechanisms for illumination and detection are used. In some cases, illumination can be ambient light. In other cases, lighting means must be provided. These lighting and optical mechanisms can be costly (depending on the system needs), make miniaturization difficult, need careful manufacture and alignment to be robust, and require a variety of component types. Moreover, modification of the frequency and exposure times is difficult.

A number of solid-state solutions to emitting light at various frequencies exist. Likewise, solid-state image capture devices, in particular CCDs, are well known and widely used. Generally, the light emission and sensing functions are not integrated in a common device, although hard-copy electro-optic read/write devices defined on or supported by a common substrate are known (EP 0 827 323 A1, by Stevens et al., published Mar. 4, 1998). U.S. Pat. No. 5,929,845, issued Jul. 27, 1999 to Wei et al., references the use of a common technology for organic LEDs to serve as both light emitters and sensors alternately. Both systems meet some of the needs cited above, but do not address exposures with various light frequencies, the organization of sensors and emitters.

There is a need therefore for an improved image capture device and method that includes self-illumination, is simple to manufacture, and supports a variety of color exposure mechanisms.

SUMMARY OF THE INVENTION

The need is met according to the present invention by providing a self-illuminating solid-state color image capture device, that includes: an array of light emitting elements and light sensing elements formed on a common substrate; the light emitting elements including first color elements adapted to emit light of a first color and second color elements adapted to emit light of a second color, and the light sensing elements being responsive to all emitted colors; and electronics coupled to the light emitting and light sensing elements for sequentially causing the first and second color elements to emit light and sensing the light reflected from a scene being captured with the light sensing elements.

DETAILED DESCRIPTION OF THE INVENTION

The shortcomings of the prior art are overcome by the present invention by the use of a common substrate integrated circuit technology combining photon output and photon sensing means at a pixel level. For near-field scenes that are very close to the integrated circuit, the following approach can be effectively used. Each imaging device contains a set of emitting micro-components distributed across the surface of an integrated circuit. The distribution of the emitters can be chosen to complement the characteristics of the media or scene to be illuminated. Associated with each set of emitters are one or more detectors. Each detector is responsive to the light emitted by any of the emitters.

Figure 1:
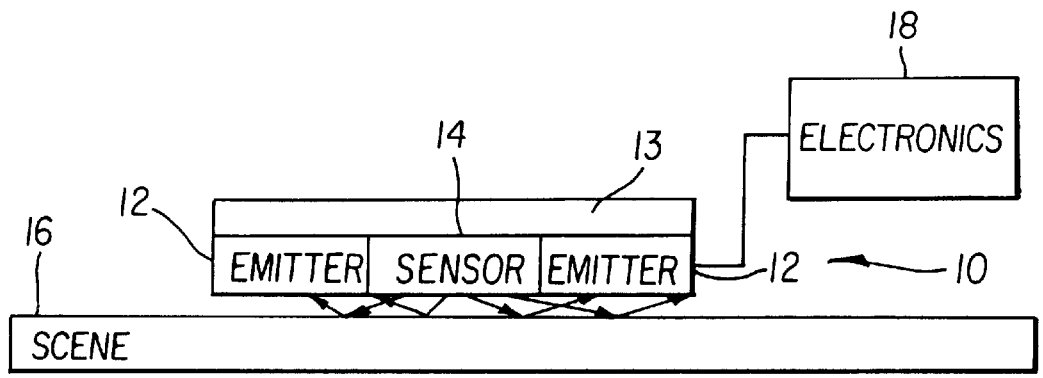
FIG. 1 is a diagram of an light emitter with two neighboring sensors gathering light reflected from a near-field scene.

Referring to FIG. 1, a self-illuminating solid-state color image capture device 10 according to the present invention includes an array of light emitting elements 12 (only two of which are shown in the Fig.) and light sensing elements 14 (only one of which is shown in the Fig.) formed on a common substrate 13. The light emitting elements 12 include first color elements adapted to emit light of a first color (e.g. red) and second color elements adapted to emit light of a second color (e.g. blue). The light sensing elements 14 are responsive to all emitted colors. Electronics 18 coupled to the light emitting and light sensing elements sequentially cause the first and second color light emitting elements 12 to emit light and the sensing elements 14 to sense the light reflected from media or scene 16 being captured by the image capture device 10. In the example shown in FIG. 1, the media or scene 16 is in the near field, and optics between the scene and the image capture device are not required.

Figure 2:
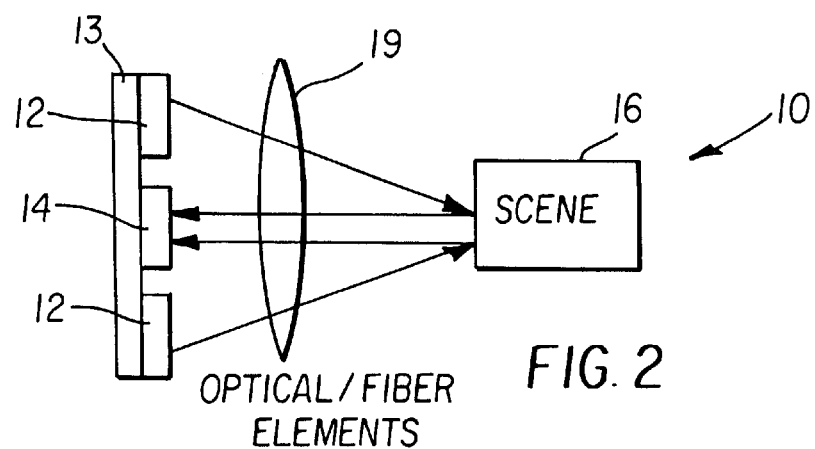
FIG. 2 is a diagram of an imaging system for a far-field scene.

Referring to FIG. 2, the image capture device 10 of the present invention may be used to capture a scene that is located in a far field of the device 10 by interposing a lens 19 between the scene and the image capture device. The lens 19 may be a traditional optic, or a self focusing fiber optic array (selfoc array) as is known in the art. At a microscopic level, the system operates as follows. Each light emitter 12 is turned on, either simultaneously (as taught in EP 0 827 323 A1) or in some chosen sequence or grouping by electronics 18. When turned on, the emitters emit photons of light. These photons strike the media or scene 16 and are absorbed, scattered or reflected. Some of the photons will travel back to the image capture device 10, strike a light sensing element 14, and their presence be recorded (as in FIG. 1). Each light sensing element 14 can then be interrogated or otherwise processed to measure the light incident upon the sensing element using standard integrated image sensor techniques well known in the art.

Taken together, the light sensing element 14 will record only the local scene illuminated as long as the distance from the media or scene 16 to the sensing element is small compared to the distances between light emitting elements and sensing elements on the substrate 13. If this is not the case, the system will not be able to distinguish photons from one location on the media with those from another, thus degrading the image captured by the device.

Note that this design does not require the use of optical components or external illumination; the only requirement is the careful arrangement of integrated light emitters and sensors, and the near-field position of the scene. In particular, both the scene and the integrated circuit must be relatively flat, parallel, and close.

For traditional far-field scenes which are at a distance from the sensor, optical elements must be inserted to appropriately focus the emitted light and the incident light from the scene to the sensor. In this case, the light is transmitted to the scene and is focused on the sensor as a traditional image plane (as in FIG. 2). There are many possible arrangements of emitting and sensing elements on the integrated circuit. In any case, the same optical components are used to convey the light emitted from the image capture device to the scene and back to the device.

Figure 3:
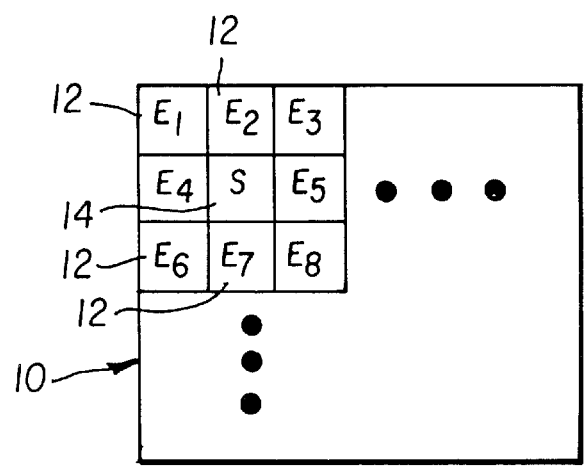
FIG. 3 shows an array of groups of emitters E surrounded by a sensor (S) on an integrated circuit.
Figure 4:
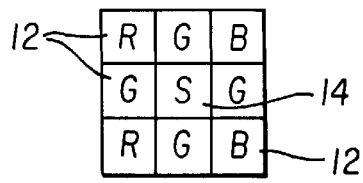
FIG. 4 shows an arrangement of colored emitters surrounding a sensor (S) on an integrated circuit.

Referring to FIG. 3, the light sensing elements 14 (designated by S) are surrounded by light emitting elements 12 (designated $E_1-E_8$) in a pattern that is repeated over the image capture device 10. Each sensor is then well placed to detect photons from the emitters and to be less responsive to emitters in a neighboring block. A variety of arrangements between the light emitters and sensors on the integrated circuit substrate 13 are possible. For example, a grid pattern could be used with a three-by-three arrangement of active devices. One example of such a pattern is shown in FIG. 4, where the light sensor elements 14 are surrounded by red (R), green (G) and blue (B) light emitting elements that includes twice as many green elements as red or blue elements.

Other arrangements of light emitting and sensing elements are useful, such as alternating columns or rows of detectors and emitters. Or, for example, adjacent blocks of sensors could share an edge. The choice depends on the nature of the materials and the task addressed. Distributing the emitters across the image capture device provides a diffuse illumination to each object in the scene and pixel location of the capture scene.

Once the incident photons have been detected, straightforward image processing techniques can be used to optimize the image or otherwise process it for the desired characteristics. For example, a traditional, regular array of pixel elements is usually desired whereas the detector layout described here may not directly correspond to the conventional pixel array. Interpolation between detected pixels or other preprocessing intended to distinguish between neighboring pixels can improve the result.

Figure 5:
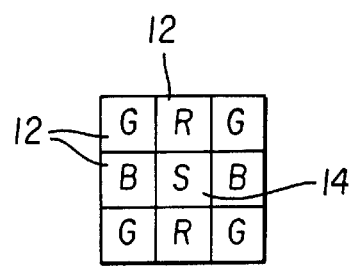
FIG. 5 shows an arrangement of colored emitters (R, G, B) surrounding a sensor (S) on an integrated circuit.
Figure 6:
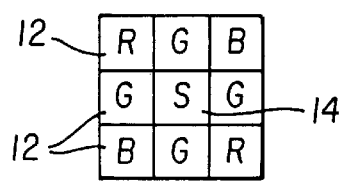
FIG. 6 shows an arrangement of colored emitters (R, G, B) surrounding a sensor (S) on an integrated circuit.

Using the grid approach described above, alternating colors in neighboring grids can be used with traditional interpolation means used to create a complete color record. FIGS. 5 and 6 illustrate alternative layouts of emitters.

These layouts (and other similar ones) can all be used within a larger grid. For example, the layout of FIG. 4 might be used alternately with the layout of FIG. 5 to form a row across an imaging device. A second row might consist of the same alternating layouts but beginning with the layout of FIG. 5 instead of FIG. 4. A third row might replicate the first row, a fourth row replicate the second, and so on. As a second example, the layouts of FIGS. 4 and 6 might alternate. Layouts other than three by three arrays can also be created. One such design utilizes a two-by-two array of sensors surrounded by twelve emitters.

Regardless of scene distance from the emitters and sensors, if multiple colored emitters are integrated in the device, more information about the scene can be obtained by controlling or sequencing the colors of the emitters. For example, turning on only red emitters could be used to create a red image, only green for a green image, etc. Since the traditional approach of creating and manufacturing colored filters as masks over sensing devices such as CCDs is complex and costly, using the appropriate color of light instead can provide system advantages. In particular, combinations of colors can be used to create other image color records to create more information about the scene. For example, red, green, and blue light emitters can be used to create red, green, blue, black and white, yellow, cyan, and magenta image records simply by using one or more colored emitters at a time. These colored records can be combined to create much higher quality images or to enhance image analysis.

Figure 7:
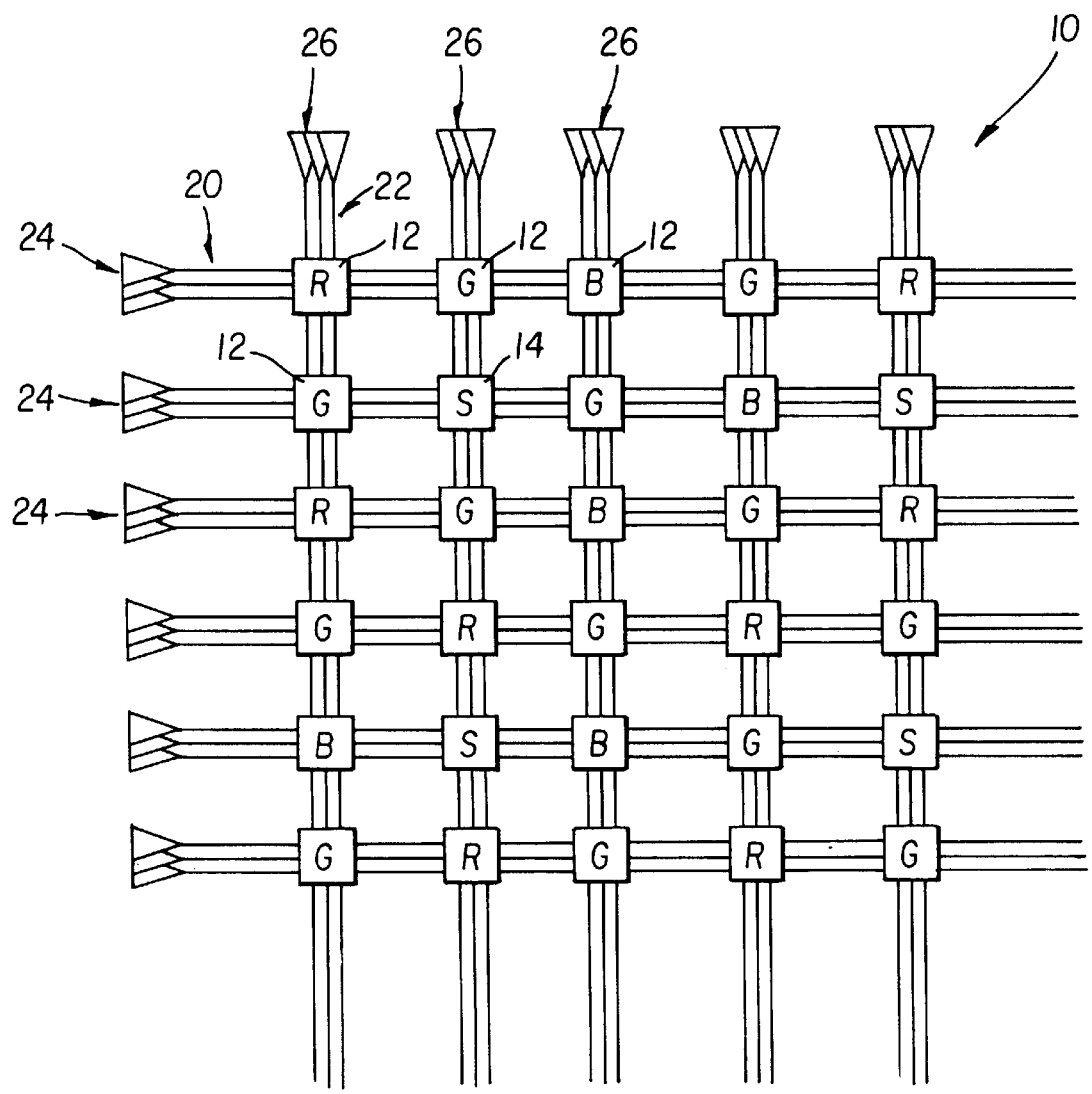
FIG. 7 shows an arrangement of drivers adapted to controlling groups of emitters.

Conventional techniques for driving and controlling the emitters can be used to operate the device. However, if a row or column of emitters includes multiple colors (as shown in FIGS. 4, 5 and 6), additional control lines must be incorporated. FIG. 7 illustrates a system with horizontal and vertical control lines 20 and 22 for each color of emitter, driven by respective drivers 24 and 26. The sensors have a separate signal line not shown. Referring to FIG. 7, we see an image capture device 10 with light emitting elements 12 and light sensing elements 14 arranged in an array. Each row and column contains three different colors of emitters R, G, and B. For each row and column, a separate control line is connected to only the red, only the green, and only the blue emitters, respectively. To activate the red emitters, the red control lines are activated, and likewise for the green and blue. If finer control is desired, subsets of the control lines can be activated or additional control lines implemented.

Sequencing the light emitters in various locations on the exposure device can also provide additional information. For example, successive rows or columns of light emitters could be turned on and their light detected to provide information about the scene. Alternatively, a higher-quality green exposure can be obtained by activating a subset of the green emitters and combining the result with a different subset. This approach provides a higher quality image since it reduces ambiguity about the source of the light (at the expense of time taken to create an entire image record). Essentially, different pixel locations are being exposed.

Alternatively, multiple non-contiguous columns, rows, or other subsets might be used to compromise between time taken to record a scene and the information quality obtained.

This illumination and recording technique is also suitable for implementation in low ambient light without a mechanical shutter. Controlling the illumination time allows the system to operate with an "optical" shutter (as taught in EP 0 827 323 A1).

Figure 8:
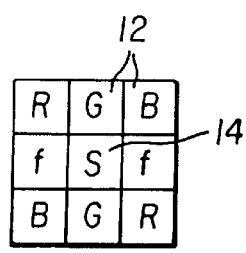
FIG. 8 shows an arrangement of colored emitters (R, G, B, f) surrounding a sensor (S) on an integrated circuit.

The sensing and illuminating devices for color imaging systems are typically red, green, and blue. Other colors are possible as well as a number of colors greater than three. Using additional colors will improve the quality of the resulting image record. Moreover, not all of the colors need be visible. Some imaging systems rely on infrared or ultraviolet light to obtain further information about the scene. The invention taught here can be readily applied to these circumstances. For example, a red, green, blue, and infrared system might use the fourth, infrared channel to record additional information about the image. In FIG. 8, the infrared light emitters are represented by an italic "f".

Figure 9:
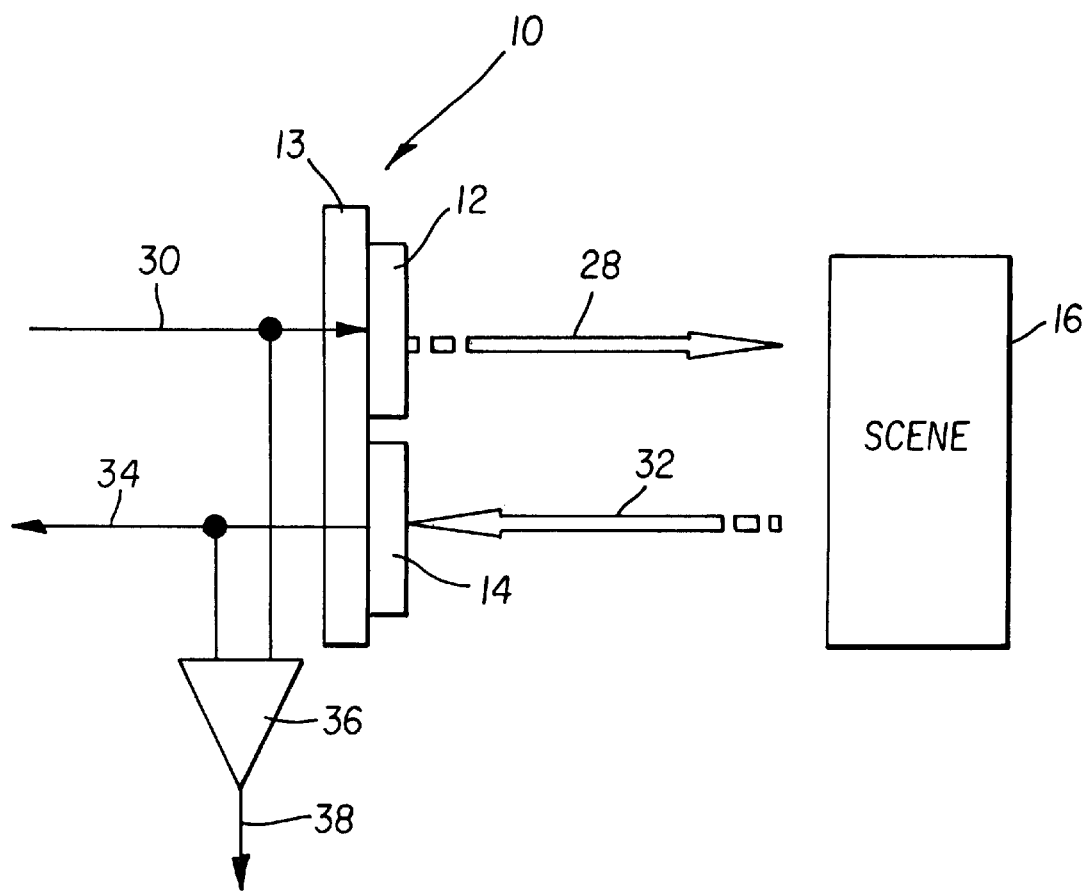
FIG. 9 shows an integrated circuit with a substrate with an emitter and a sensor, and a comparison device.

An image capture device with invisible light exposure can be used to directly create a "color" record corresponding to the light emitted. If a scene contains data of interest in the corresponding frequency range, this data can be sensed. Moreover, by modulating the radiation emitted in cooperation with the sensor elements, other information might be obtained, such as absolute or relative distance from the image capture device to the objects in the scene. In its simplest form, this is illustrated in FIG. 9. Referring to FIG. 9 we see a substrate 13 on which a light emitting element 12 emits modulated light 28 in response to a modulated signal 30. The modulated light travels to a media or scene 16. Reflected light 32 reflected from the media or scene 16 travels to a light sensing element 14 which creates a corresponding signal 34. The corresponding signal 34 is compared with the original modulated signal 30 via a comparator 36 to produce a difference signal 38. If the signal 34 is continuously modulated, a comparison between the phase of the original modulated signal 30 and the reflected signal 34 will provide relative distance information. Alternatively, if the modulated signal 30 is an impulse, a comparison of the time that the light was emitted to the time that a signal was received will produce an elapsed time which can be used to compute the distance to the object reflecting the light. The signal comparison can be done in an analog form or digitized and processed using traditional computing techniques. Moreover, the supporting electronic circuitry might be resident either on the image capture device 10 or in some other portion of a larger imaging system.

In a preferred embodiment, the invention is employed in a device that includes Organic Light Emitting Diodes (OLEDs) which are composed of small molecule polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. These disclosures provide a technical platform on which an integrated image capture device can be constructed. Many combinations and variations of OLED can be used to fabricate such a device. OLED devices can be integrated in a micro-circuit on a conventional silicon substrate 13 and exhibit the necessary characteristics. Alternatively, OLED devices may also be integrated upon other substrates, such as glass having a pattern of conductive oxide and amorphous, polycrystalline, or continuous grain silicon material deposited thereon. The deposited silicon materials may be single-crystal in nature or be amorphous, polycrystalline, or continuous grain. These deposited materials and substrates are known in the prior art and this invention, and may be applied equally to any micro-circuit integrated on a suitable substrate.

OLED devices can be created to emit light at virtually any frequency and at a wide output angle. Moreover, the conventional integrated circuit base allows the integration of light sensing devices within the same circuit with the use of reverse-biased diodes. Thus, a common technology can be used to support both light emission and sensing. The OLED devices can also be created to emit or sense a wide variety of narrow frequency ranges, enabling color-dependent imaging control. Conventional logical control mechanisms can be integrated into the device.

The invention has been described in detail with particular reference to certain preferred embodiments thereof, but it will be understood that variations and modifications can be effected within the spirit and scope of the invention.

PARTS LIST 10 image capture device
12 light emitting element
13 substrate
14 light sensing element
16 media or scene
18 electronics
19 lens
20 horizontal control lines
22 vertical control lines
24 element drivers
26 element drivers
28 modulated light
30 modulated signal
32 reflected light
34 signal
36 comparator
38 difference signal

What is claimed is:

1. A self-illuminating solid-state color image capture device, comprising:
   a) an array of light emitting elements and light sensing elements formed on a common substrate;
   b) the light emitting and light sensing elements being arranged in groups, each group including a single light sensing element surrounded by a plurality of light emitting elements in a pattern that is repeated over the image capture device, the light emitting elements including a first color element adapted to emit light of a first color and a second color element adapted to emit light of a second color, and the light sensing element being responsive to all emitted colors; and
   c) electronics coupled to the light emitting and light sensing elements for sequentially causing the first and then the second color light emitting elements in all of the groups to simultaneously emit light and for causing the sensing elements in all of the groups to sequentially sense the first colored light and then the second colored light reflected from a scene being captured with the image capture device.

2. The color image capture device claimed in claim 1, wherein the light sensing and light emitting elements are organic light emitting diodes.

3. The color image capture device claimed in claim 1, wherein the first color elements are infrared emitting.

4. The color image capture device claimed in claim 1, wherein the first color elements are ultraviolet emitting.

5. The color image capture device claimed in claim 1, wherein the light emitting and light sensing elements are arranged in rows and columns.

6. The color image capture device claimed in claim 2 wherein the organic light emitting diodes are deposited on a single-crystal Silicon substrate.

7. The color image capture device claimed in claim 2 wherein the organic light emitting diodes are deposited on a glass substrate having a pattern of conductive oxide and amorphous, polycrystalline, or continuous grain silicon material.

8. The color image capture device claimed in claim 1, further comprising an optical element to transport light to and from the scene to be captured.

9. The color image capture device claimed in claim 1, wherein the control electronics sequentially causes subsets of the light emitting elements of a color to emit light, whereby the resolution of the image capture device is improved.

10. The color image capture device claimed in claim 1, wherein the control electronics sequentially causes subsets of the light sensing elements to sense light, whereby the resolution of the image capture device is improved.

11. The color image capture device claimed in claim 1 wherein the electronics further includes means for modulating the light emitting elements and means for processing the signals produced by the light sensing elements to obtain additional information about the scene.

12. The color image capture device claimed in claim 11, wherein the additional information about the scene is distance information to objects in the scene.

13. A method of capturing a color image of a scene, comprising the steps of:
   a) providing an array of light emitting elements and light sensing elements formed on a common substrate, the light emitting and light sensing elements being arranged in groups, each group including a single light sensing element surrounded by a plurality of light emitting elements in a pattern that is repeated over the image capture device, the light emitting elements including a first color element adapted to emit light of a first color and a second color element adapted to emit light of a second color, and a light sensing element responsive to light of the first and second colors; and
   b) sequentially causing the first and then the second color light emitting elements in all of the groups to simultaneously emit light; and
   c) sequentially sensing the first colored light and then the second colored light reflected from the scene being captured with the light sensing elements.

14. The method claimed in claim 13, wherein the scene is a two dimensional image.

15. The method claimed in claim 13, wherein the scene includes three dimensional objects.

16. The method claimed in claim 14, wherein one of the colors is invisible, and wherein the two dimensional image includes an invisible layer of information.

17. The method claimed in claim 15, further including the steps of modulating the light emitting elements and processing the signals produced by the light sensing elements to obtain additional information about the scene.

18. The method claimed in claim 13, further comprising the steps of sequentially causing subsets of the light emitting elements of a color to emit light, whereby the resolution of the image capture method is improved.

19. The method claimed in claim 13, further comprising the step of sequentially causing subsets of the light sensing elements to sense light, whereby the resolution of the image capture method is improved.

20. The method claimed in claim 13, further including the step of modulating the light emitting elements and processing the signals produced by the light sensing elements to obtain additional information about the scene.

21. The method claimed in claim 20, wherein the additional information about the scene is distance information to objects in the scene.

22. The system claimed in claim 1, wherein the array of emitter elements and sensor elements are as shown here together with any reflection or rotation of the arrangement

| R | G | B |
|---|---|---|
| G | S | G |
| R | G | B | where R, G, and B represent red, green, and blue emitters respectively, and S represents a sensor.

23. The system claimed in claim 1, wherein the array of emitter elements and sensor elements are as shown here together with any reflection or rotation of the arrangement

| G | R | G |
|---|---|---|
| B | S | B |
| G | R | G | where R, G, and B represent red, green, and blue emitters respectively, and S represents a sensor.

24. The system claimed in claim 1, wherein the array of emitter elements and sensor elements are as shown here together with any reflection or rotation of the arrangement

| R | G | B |
|---|---|---|
| G | S | G |
| B | G | R | where R, G, and B represent red, green, and blue emitters respectively, and S represents a sensor.

25. The system claimed in claim 1, wherein the array of emitter elements and sensor elements are as shown here together with any reflection or rotation of the arrangement

| R | G | B |
|---|---|---|
| f | S | f |
| B | G | R | where R, G, B, and f represent red, green, and blue and infrared emitters respectively, and S represents a sensor.

26. A self-illuminating solid-state color image capture device, comprising:
   a) an array of light emitting elements and light sensing elements formed on a common substrate;
   b) the light emitting and light sensing elements being arranged in groups, each group including a single light sensing element surrounded by a plurality of light emitting elements in a pattern that is repeated over the image capture device, the light emitting elements including a first color element adapted to emit infrared light and a second color element adapted to emit light of a second color, and the light sensing element being responsive to all emitted colors; and
   c) electronics coupled to the light emitting and light sensing elements for sequentially causing the first and then the second color light emitting elements in all of the groups to simultaneously emit light and for causing the sensing elements in all of the groups to sequentially sense the infrared light and then the second colored light reflected from a scene being captured with the image capture device.

27. A method of capturing a color image of a scene, comprising the steps of:

a) providing an array of light emitting elements and light sensing elements formed on a common substrate, the light emitting and light sensing elements being arranged in groups, each group including a single light sensing element surrounded by a plurality of light emitting elements in a pattern that is repeated over the image capture device, the light emitting elements including a first color element adapted to emit infrared light and a second color element adapted to emit light of a second color, and a light sensing element responsive to the infrared light and the second colored light; and b) sequentially causing the first and then the second color light emitting elements in all of the groups to simultaneously emit light; and c) sequentially sensing the infrared light and then the second colored light reflected from the scene being captured with the light sensing elements.

* * * * *